(12) United States Patent
Gotoh et al.

(10) Patent No.: US 7,291,289 B2
(45) Date of Patent: Nov. 6, 2007

(54) PHOSPHOR AND PRODUCTION METHOD OF THE SAME AND LIGHT SOURCE AND LED USING THE PHOSPHOR

(75) Inventors: Masahiro Gotoh, Tokyo (JP); Akira Nagatomi, Tokyo (JP); Kenji Sakane, Tokyo (JP); Shuji Yamashita, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 263 days.

(21) Appl. No.: 10/922,086

(22) Filed: Aug. 20, 2004

(65) Prior Publication Data

US 2005/0253500 A1  Nov. 17, 2005

(30) Foreign Application Priority Data

May 14, 2004  (JP) .............................. 2004-145718

(51) Int. Cl.
C09K 11/78 (2006.01)
H01L 33/00 (2006.01)
(52) U.S. Cl. .................. 252/301.4 F; 252/301.6 F; 313/503; 257/98
(58) Field of Classification Search ......... 252/301.4 F, 252/301.6 F; 257/98; 313/503
See application file for complete search history.

(56) References Cited

U.S. PATENT DOCUMENTS

| | | | |
|---|---|---|---|
| 18,985 A | 12/1857 | Olds | |
| 2,121,275 A | 6/1938 | Zober et al. | |
| 3,527,595 A | 9/1970 | Adler et al. | |
| 4,477,689 A | 10/1984 | Ogasahara et al. | |
| 4,576,736 A | 3/1986 | Harmuth | |
| 5,398,398 A | 3/1995 | Williams et al. | |
| 5,447,291 A | 9/1995 | Sandhage | |
| 6,670,748 B2 | 12/2003 | Ellens et al. | |
| 7,138,756 B2 | 11/2006 | Gotoh et al. | |
| 2003/0030038 A1 | 2/2003 | Mitomo et al. | |
| 2003/0030368 A1 | 2/2003 | Ellens et al. | |

(Continued)

FOREIGN PATENT DOCUMENTS

EP   0 459 156 A2   4/1991

(Continued)

OTHER PUBLICATIONS

U.S. Appl. No. 10/984,772, filed Nov. 10, 2004, Nagatomi et al.

(Continued)

*Primary Examiner*—C. Melissa Koslow
(74) *Attorney, Agent, or Firm*—Oliff & Berridge, PLC

(57) ABSTRACT

A phosphor with high efficiency having an excitation band corresponding to light of the ultraviolet-visible (300 to 550 nm) wavelength region emitted from a light emitting element which emits blue or ultraviolet light is provided. Commercially available CaO [3N], $Si_3N_4$ [3N], and $Eu_2O_3$ [3N] are prepared, respective materials are weighed and mixed to have a mol ratio of $CaO:Si_3N_4:Eu_2O_3=1.4775:1:0.01125$, and then the mixture is heated to 1600° C. by a heating rate of 15° C./min under a nitrogen atmosphere and retained and fired at 1600° C. for three hours. Thereafter, the raw materials are cooled down from 1600° C. to 200° C. for an hour to thereby produce a phosphor having a composition formula $Ca_{1.58}Si_3O_{1.63}N_{4.35}:Eu_{0.024}$.

16 Claims, 8 Drawing Sheets

U.S. PATENT DOCUMENTS

| | | |
|---|---|---|
| 2003/0094893 A1 | 5/2003 | Ellens et al. |
| 2003/0132422 A1 | 7/2003 | Tian et al. |
| 2003/0152804 A1 | 8/2003 | Miura et al. |
| 2003/0213611 A1 | 11/2003 | Morita |
| 2004/0155225 A1 | 8/2004 | Yamada et al. |
| 2004/0263074 A1 | 12/2004 | Baroky et al. |
| 2005/0189863 A1 | 9/2005 | Nagatomi et al. |
| 2005/0203845 A1 | 9/2005 | Yoshimine et al. |
| 2005/0205845 A1 | 9/2005 | Deising et al. |
| 2005/0253500 A1 | 11/2005 | Gotoh et al. |
| 2005/0267243 A1 | 12/2005 | Amasaki et al. |
| 2006/0006782 A1 | 1/2006 | Nagatomi et al. |
| 2006/0017365 A1 | 1/2006 | Nagatomi et al. |
| 2006/0021788 A1 | 2/2006 | Kohayashi et al. |
| 2006/0022573 A1 | 2/2006 | Gotoh et al. |
| 2006/0033083 A1 | 2/2006 | Sakane et al. |
| 2006/0043337 A1 | 3/2006 | Sakane et al. |
| 2006/0045832 A1 | 3/2006 | Nagatomi et al. |
| 2006/0065878 A1 | 3/2006 | Sakane et al. |
| 2006/0076883 A1 | 4/2006 | Himaki et al. |
| 2006/0091790 A1 | 5/2006 | Nagatomi et al. |
| 2006/0170332 A1 | 8/2006 | Tamaki et al. |
| 2006/0197432 A1 | 9/2006 | Nagatomi et al. |
| 2006/0197439 A1 | 9/2006 | Sakane et al. |
| 2006/0220047 A1 | 10/2006 | Nagatomi et al. |
| 2006/0220520 A1 | 10/2006 | Sakane et al. |
| 2006/0244356 A1 | 11/2006 | Nagatomi et al. |
| 2007/0029525 A1 | 2/2007 | Gotoh et al. |

FOREIGN PATENT DOCUMENTS

| | | |
|---|---|---|
| EP | 1 296 376 A2 | 3/2003 |
| EP | 1 445 295 A1 | 8/2004 |
| JP | 05-015655 | 1/1993 |
| JP | 05-198433 | 8/1993 |
| JP | 11-144938 | 5/1999 |
| JP | 11-277527 | 10/1999 |
| JP | 2000-073053 | 3/2000 |
| JP | 2000-153167 | 6/2000 |
| JP | 2001-214162 | 8/2001 |
| JP | 2001-214162 A | 8/2001 |
| JP | 2002-363554 | 12/2002 |
| JP | 2003-013059 | 1/2003 |
| JP | 2003-096446 | 4/2003 |
| JP | 2003-124527 | 4/2003 |
| JP | 2003-124527 A | 4/2003 |
| JP | 2003-515655 A | 5/2003 |
| JP | 2003-515655 | 7/2003 |
| JP | 2003-277746 | 10/2003 |
| JP | 2003-277746 A | 10/2003 |
| JP | 2003-336059 | 11/2003 |
| JP | 2003-336059 A | 11/2003 |
| JP | 2004-055910 | 2/2004 |
| JP | 2004-505470 | 2/2004 |
| JP | 2004-067837 | 3/2004 |
| JP | 2004-067837 A | 3/2004 |
| JP | 2004-189997 | 7/2004 |
| JP | 2004-235598 | 8/2004 |
| JP | 2004-244560 | 9/2004 |
| JP | 2004-055536 | 12/2004 |
| JP | 2005-344025 | 12/2005 |
| JP | 2006-028295 | 2/2006 |
| JP | 2006-063214 | 3/2006 |
| JP | 2006-063286 | 3/2006 |
| JP | 2006-070109 | 3/2006 |
| JP | 2006-176546 | 7/2006 |
| WO | WO 01/40403 A1 | 6/2001 |
| WO | WO 02/11214 A1 | 2/2002 |
| WO | WO 2004/030109 A1 | 4/2004 |
| WO | WO 2004/039915 A1 | 5/2004 |
| WO | WO 2004/055910 A1 | 7/2004 |
| WO | WO 2005/052087 A1 | 6/2005 |

OTHER PUBLICATIONS

U.S. Appl. No. 11/061,669, filed Feb. 22, 2005, Nagatomi et al.
U.S. Appl. No. 11/063,847, filed Feb. 23, 2005, Sakane et al.
U.S. Appl. No. 11/149,317, filed Jun. 10, 2005, Nagatomi et al.
U.S. Appl. No. 11/149,192, filed Jun. 10, 2005, Sakane et al.
U.S. Appl. No. 11/198,281, filed Aug. 8, 2005, Nagatomi et al.
U.S. Appl. No. 11/194,590, filed Aug. 2, 2005, Gotoh et al.
U.S. Appl. No. 11/211,751, filed Aug. 26, 2005, Sakane et al.
U.S. Appl. No. 11/218,504, filed Sep. 6, 2005, Nagatomi et al.
JIS Z 8726; "Method of Specifying Colour Rendering Properties of Light Sources"; (1990), pp. 381-390.
"Phosphor Handbook"; (compiled by Phosphor Research Society, published by Ohmusha, Ltd., 1987); pp. 172-176.
U.S. Appl. No. 11/194,590, filed Aug. 2, 2005.
K. Uheda et al., "The Crystal Structure and Photoluminescence Properties of a New Red Phosphor, Calcium Aluminum Silicon Nitride Doped With Divalent Euroium," Abs. 2073, 206th Meeting., Oct. 3, 2004.

Ex: 460nm

Em: 609nm

Ex:460nm

Em:624nm

PHOSPHOR AND PRODUCTION METHOD OF THE SAME AND LIGHT SOURCE AND LED USING THE PHOSPHOR

BACKGROUND OF THE INVENTION

1. Field of the Invention

The present invention relates to a phosphor used in a display device such as an LED, CRT, PDP, FED, and EL, and a lighting unit such as a vacuum fluorescent display and fluorescent lamp. More particularly, the present invention relates to a phosphor and a production method of the same, the phosphor being suitable for an LED, a light source, a lighting unit and the like each of which has a light emitting portion and a phosphor of ultraviolet-blue light or the like and emits visible light or white light by cooperation of both the light emitting portion and the phosphor, and to a light is source and an LED using the phosphor.

2. Description of the Related Art

An LED, a light source and a lighting unit are known, which emit white light by a combination of a light emitting portion constituted of a light emitting element which emits blue or ultraviolet light by itself and a phosphor which has an excitation band in the ultraviolet-blue wavelength region generated from the light emitting element and, upon excitation by the light of that wavelength region, emits fluorescent light of a predetermined wavelength region.

As the phosphor used in the LED and the like, phosphors represented by general formulas $Y_2O_2S:Eu$, $La_2O_2S:Eu$, $3.5MgO.0.5MgF_2.GeO_2:Mn$, and $(La, Mn, Sm)_2O_2S.Ga_2O_3$ are known as a phosphor which emit red fluorescent light, phosphors represented by general formulas $ZnS:Cu,Al$, $SrAl_2O_4:Eu$, and $BAM:Eu,Mn$ are known as a phosphor which emits green fluorescent light, a phosphor represented by a general formula $YAG:Ce$ is known as a phosphor which emits yellow fluorescent light, and phosphors represented by general formulas $BAM:Eu$, $Sr_5(PO_4)_3Cl:Eu$, $ZnS:Ag$, and $(Sr, Ca, Ba, Mg)_{10}(PO_4)_6 Cl:Eu$ are known as phosphors which emit blue fluorescent light. Then, there are suggested an LED, a light source and a lighting unit which emit white or monochromatic light using a combination of these phosphors and a light emitting element which emits blue or ultraviolet light by itself.

Furthermore, in recent years, as the phosphor having the excitation band in the ultraviolet-blue wavelength region, there are suggested an oxynitride glass phosphor (for example, refer to Patent Document 1), a phosphor having a sialon as a host material (for example, refer to Patent Documents 2, 3 and 4), and a phosphor including nitrogen of a silicon nitride group or the like (for example, refer to Patent Documents 5 and 6), and there are suggested an LED, a light source and a lighting unit which emit white or monochromatic light using a combination of these phosphors and a light emitting element which emits blue or ultraviolet light by itself.

[Patent Document 1] Japanese Patent Application Laid-open No. 2001-214162

[Patent Document 2] Japanese Patent Application Laid-open No. 2003-336059

[Patent Document 3] Japanese Patent Application Laid-open No. 2003-124527

[Patent Document 4] Japanese Patent Application Laid-pen No. 2004-67837

[Patent Document 5] Translated National Publication of Patent Application No. 2003-515655

[Patent Document 6] Japanese Patent Application Laid-open No. 2003-277746

SUMMARY OF THE INVENTION

With respect to the above-described LED and light source which emit visible light or white light by a combination of a light emitting portion constituted of a light emitting element which emits light of the ultraviolet-blue wavelength by itself and a phosphor which has an excitation band corresponding to light of the ultraviolet-blue wavelength region generated from the light emitting portion and emits fluorescent light of a predetermined wavelength region, it is strongly demanded to improve not only the emission efficiency of the light emitting portion but also the emission efficiency of fluorescent light of the phosphor, in order to improve luminance of the visible light or white light. This is because the luminance of the entire white light source can be improved by the emission efficiency of the phosphor.

Hereinafter, the emission efficiency of the phosphor will be described with an example of an LED which emits white light by a combination of a light emitting element which emits ultraviolet-blue light and a phosphor which emits yellow-red fluorescent light.

For example, a YAG:Ce based yellow phosphor which emits yellow fluorescent light has an efficient excitation range for emitting fluorescent light by blue light emitted by a light emitting element in an LED, so that it can produce good yellow light emission. However, when the light emitting element in the LED emits ultraviolet light, it deviates from the excitation range of the phosphor, so that it cannot produce yellow light emission with high efficiency.

Further, as a red phosphor which emits red fluorescent light, no existing phosphor has been obtained that has an excitation band corresponding to light of the ultraviolet-blue wavelength region and emits red light with high efficiency.

Then, when an LED which emits white light is manufactured, a method is adopted such that a light emitting element in an LED is made to emit blue light, and, regarding a phosphor, the compounding ratio of a red phosphor is made larger than those of phosphors of other colors to compensate a red light emitting amount.

Accordingly, in order to improve the emission efficiency of the LED which emits white light, there have been demanded a phosphor having an excitation band corresponding to light of the ultraviolet-visible (300 to 550 nm) wavelength region and high emission efficiency, and a phosphor of the aforementioned type which further emits yellow to red fluorescent light.

The present invention is made in view of the above described situation, and an object thereof is to provide a phosphor having an excitation band corresponding to light of the ultraviolet-visible (300 to 550 nm) wavelength region emitted from a light emitting element which emits blue or ultraviolet light, the phosphor having high emission efficiency and further capable of emitting fluorescent light in a wide range of visible light.

As a result of study on host material compositions of various phosphors with respect to the above-described object, the inventors of the present invention devised a phosphor with higher efficiency and an excellent light emitting characteristic, which has a new host material composition that is easy to be produced.

Specifically, according to a first aspect of the present invention to solve the above-described problem, a phosphor represented by a general formula $M_{a+p}Si_3O_{a+q}N_{4+r}:Z$ is provided, wherein M is a divalent element, Z is an element to be an activator, "a" is in a range of $0<a\leq10$, "p" is in a range of $-a/2<p<a/2$, "q" is in a range of $-a/2<q<2a$, and "r" is in a range of $2<r<2$.

According to a second aspect of the present invention, the phosphor described in the first aspect is provided, wherein M is at least one or more elements selected from the group consisting of beryllium, magnesium, calcium, strontium, barium, zinc, cadmium, and mercury, and Z is at least one or more elements selected from rare-earth elements or transition metal elements.

According to a third aspect of the present invention, the phosphor described in the first or the second aspect is provided, wherein "a" is in a range of $0<a\leqq6$.

According to a fourth aspect of the present invention, the phosphor described in any one of the first to the third aspect is provided, wherein M is at least one or more elements selected from the group consisting of magnesium, calcium, strontium, barium, and zinc.

According to a fifth aspect of the present invention, the phosphor described in any one of the first to the fourth aspect is provided, wherein Z is at least one or more elements selected from the group consisting of europium, manganese, and cerium.

According to a sixth aspect of the present invention, the phosphor described in any one of the first to the fifth aspect is provided, wherein Z is europium.

According to a seventh aspect of the present invention, the phosphor described in any one of the first to the fifth aspect is provided, wherein M is calcium.

According to an eighth aspect of the present invention, the phosphor described in any one of the first to the fifth aspect is provided, wherein M is strontium.

According to a ninth aspect of the present invention, the phosphor described in any one of the first to the eighth aspect is provided, wherein Z content is 0.0001 mol or more and 0.5 mol or less when the corresponding M is one mol.

According to a tenth aspect of the present invention, the phosphor described in any one of the first to the ninth aspect is provided wherein the phosphor is in a powder form.

According to an eleventh aspect of the present invention, the phosphor described in the tenth aspect is provided, wherein an average particle size of the phosphor is 20 μm or less and 0.1 μm or more.

According to a twelfth aspect of the present invention, a production method of a phosphor which is represented by a general formula $M_{n+p}Si_3O_{a+q}N_{4+r}:Z$, in which M is a divalent element, Z is an activator, "a" is in a range of $0<a\leqq10$, "p" is in a range of $-a/2<p<a/2$, "q" is in a range of $-a/2<q<2a$, and "r" is in a range of $-2<r<2$ is provided, wherein one or more kind selected from an oxide, a carbonate, a nitride, a hydroxide, and a basic carbonate of M is used as a raw material of M, a silicon dioxide and/or a silicon nitride are/is used as a raw material of the silicon, and a silicon nitride and/or a nitride of M are/is used as a raw material of N.

According to a thirteenth aspect of the present invention, a light source comprising a phosphor described in any one of the first to the eleventh aspect and a light emitting portion is provided.

According to a fourteenth aspect of the present invention, the light source described in the thirteenth aspect is provided, wherein a wavelength of light emitted by the light emitting portion is from 300 to 550 nm.

According to a fifteenth aspect of the present invention, a light emitting diode comprising a phosphor described in any one of the first to the eleventh aspect and a light emitting portion is provided.

According to a sixteenth aspect of the present invention, the light emitting diode described in the fifteenth aspect is provided, wherein a wavelength of light emitted by the light emitting portion is from 300 to 550 nm.

The phosphor according to any one of the first to the eleventh aspect represented by the general formula $M_{n+p}Si_3O_{a+q}N_{4+r}:Z$ has an excitation band corresponding to ultraviolet-green light (wavelength region from 300 to 550 nm) and emits light with high efficiency. Further, the phosphor does not include aluminum which is liable to be oxidized in a composition part that is a skeletal structure and excellent in oxidation resistance since it includes oxygen. Furthermore, the phosphor has a longer lifetime and is easy to be produced.

According to the twelfth aspect, the phosphor represented by the general formula $M_{a+p}S_3O_{n+q}N_{4+r}:Z$ is produced using raw materials with high purity which are easy to be obtained, so that a high-performance phosphor can be produced at low cost.

According to the thirteenth or the fourteenth aspect, a highly efficient light source having a desired light emission color can be obtained, and according to the fifteenth or the sixteenth aspect, a highly efficient light emitting diode having a desired light emission color can be obtained.

DETAILED DESCRIPTION OF THE PREFERRED EMBODIMENTS

Figure 1:
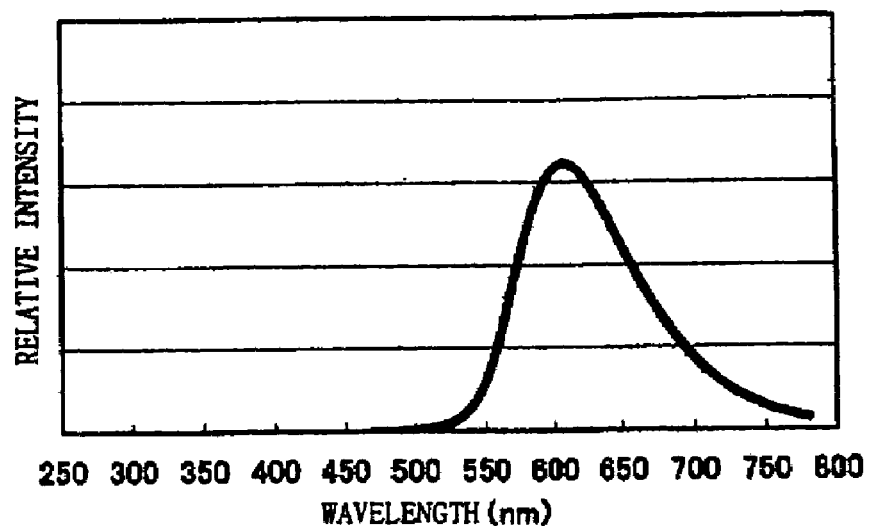
FIG. 1 is a view showing an emission spectrum of a phosphor made in Example 1.

A phosphor according to the present invention is a phosphor having a host material structure represented by a general formula $M_{a+p}Si_3O_{a+q}N_{4+r}:Z$.

Here, M is a divalent element in the phosphor. Z is an element which operates as an activator in the phosphor. Further, "a" is in a range of $0<a\leq10$, more preferably in a range of $0<a\leq6$, "p" is $-a/2<p<a/2$, "q" is $-a/2<q<2a$, and "r" is $-2<r<2$. When the phosphor has this host material structure, it becomes a phosphor having high emission efficiency.

The divalent element M is preferably at least one or more elements selected from the group consisting of Be, Mg, Ca, Sr, Ba, Zn, Cd and Hg. In other words, the element M may be single Ca or a mixture of Ca, Mg, . . . and so on.

Further, the element Z as an activator is preferably at least one or more elements selected from rare-earth elements and transition metal elements. In other words, the element Z may be single Eu or a mixture of Eu, La, . . . and the like for example.

By the element M and the element Z which have the above-described composition, the emission efficiency of the phosphor increases further.

When the divalent element M is at least one or more elements selected from the group consisting of Mg, Ca, Sr, Ba and Zn, the emission efficiency of the phosphor according to the present invention increases further, and an environmental load also decreases, so that it is a further preferable composition.

When the element Z to be an activator is at least one or more elements selected from the group consisting of Eu, Mn and Ce, the emission efficiency of the phosphor increases further, so that it is a further preferable composition.

Additionally, when the element Z is Eu, the light emitting wavelength of the phosphor exhibits a peak at the wavelength of orange, so that an orange based phosphor can be obtained, which is suitable for a light emitting unit such as a white LED with high emission efficiency, so that it is a preferable composition.

Here, when the element M is Ca and/or Sr and the element Z is Eu, it is easy to obtain raw materials, environmental loads are small, and a light emitting wavelength of the phosphor exhibits a peak at the wavelength of orange, so that an orange based phosphor can be obtained, which is suitable for a light emitting unit such as a white LED with high emission efficiency, so that it is a preferable composition.

For the phosphor according to the present invention, the addition amount of the element Z is preferably in a range from 0.0001 mol to 0.5 mol for one corresponding element M. When the addition amount of the element Z is in this range, it is possible to avoid decrease of emission efficiency due to concentration quenching caused by an excessive content of the activator, and on the other hand, it is also possible to avoid decrease of light emission efficiency due to an excessively small amount of light emission contributing atoms caused by an excessively small content of the activator. Depending on the type of the activator element Z to be added, an optimum amount of adding the element Z differs slightly, but more preferably, high emission efficiency is obtained when the amount is in a range from 0.0005 mol to 0.1 mol.

Then, a light source with high efficiency which emits visible or white light can be produced by combining the phosphor according to the present invention with, for example, a light emitting element which emits ultraviolet to green light, and further with another phosphor if desired.

Specifically, the phosphor which is obtained according to the present invention emits green to red fluorescent light with high efficiency upon reception of light in a wide excitation range from 300 to 550 nm, so that a light source of visible light or white light with high efficiency can be produced by combining the phosphor with a light source which emits ultraviolet to green light, and further with another phosphor if desired.

As a concrete example, an LED of monochromatic visible light or white light with high efficiency can be produced by combining the phosphor obtained according to the present invention with an LED light emitting portion which emits ultraviolet to green light, and further with another phosphor if desired.

Specifically, the phosphor which is obtained according to the present invention emits green to red fluorescent light with high efficiency upon reception of light in the wide excitation range of 300 to 550 nm, so that the LED of monochromatic visible light or white light with high efficiency can be produced by combining the phosphor with the LED light emitting portion which emits ultraviolet to green light, and further with another phosphor if desired.

(Production Method of the Phosphor)

A production method of the phosphor according to the present invention will be described with an example of production of a phosphor in which the element M is Ca and the element Z is Eu.

As a raw material for Ca that is the element M, an oxide, carbonate, hydroxide, or nitride of Ca can be used. As a raw material for Si, $Si_3N_4$ or $SiO_2$ can be preferably used. As a raw material for N, $Si_3N_4$ or a nitride of M (for example, a nitride of Ca) can be preferably used. As a raw material for Eu as the element Z, $Eu_2O_3$ can be preferably used. The respective raw materials may be a commercially available raw material. Since they are preferred to have high purity, raw materials of 2N or higher, or more preferably 3N or higher are prepared.

When producing a phosphor having Ca as the element M, a compound of CaO [3N], $CaCO_3$ [3N], $Ca(OH)_2$ [3N] and the like may be prepared as a raw material for the element M. As the element Z, $Eu_2O_3$ [3N] may be prepared. As a raw material for Si and N, $Si_3N_4$ [3N] may be prepared.

When compounding these, raw materials, the respective raw materials are weighed to have a mol ratio of $CaO:Si_3N_4:Eu_2O_3=1.4775:1:0.01125$ for example. Mixing of the weighed raw materials may be carried out by a general mixing method using a mortar or the like. The mixing may be carried out in the atmosphere, but when CaO or $Ca(OH)_2$ are used as raw materials, they may react to moisture or carbon dioxide in the atmosphere and change in formation, and further the raw material $Si_3N_4$ may be oxidized by the oxygen in the atmosphere, so that it is preferred to be carried out under an inert atmosphere from which moisture is removed. For example, operation inside a glove box under an inert atmosphere is convenient.

The raw materials after being completely mixed are heated to 1600° C. by a heating rate of 15° C./min in an inert atmosphere of nitrogen or the like, and retained and fired at 1600° C. for three hours. After the firing is completed, the raw materials are cooled down from 1600° C. to 200° C. for an hour, and further cooled down to the room temperature. After the cooling down is completed, the fired materials are pulverized using a pulverizing means such as a mortar, ball mill, or the like to have a predetermined average particle size (preferably, from 20 µm to 0.1 µm) to thereby obtain a phosphor having Ca as the element M. A composition analysis was performed on the produced phosphor, and a result was $Ca_{1.6}Si_3O_{1.63}N_{4.35}$:$Eu_{0.024}$.

With respect to the above-described production method of the phosphor according to the present invention, the firing temperature and the heating rate were changed, respective samples were prepared with the element M being replaced with an element other than Ca such as Sr and with the element Z being replaced with an element other than Eu such as Mn, and, while selecting the element M and the element Z, a tolerance on displacement of composition ratio in a host material structure of the phosphor was considered.

As a result, it was found that the phosphor exhibits excellent emission efficiency when the host material structure of the phosphor is represented by the general formula $M_{a+p}Si_3O_{a+q}N_{4+r}$:$Z$ and "a" is in a range of $0 < a \leq 10$, more preferably in a range of $0 < a \leq 6$, "p" is in a range of $-a/2 < p < a/2$, "q" is in a range of $-a/2 < q < 2a$, and "r" is in a range of $-2 < r < 2$.

It should be noted that the values of "a," "p," "q," and "r" can be controlled by amounts of oxygen and nitrogen included in the raw material of the element M, which is an oxide, carbonate, hydroxide, or nitride of M, and by amounts of oxygen and nitrogen included in the raw materials of Si, which is $Si_3N_4$ or $SiO_2$, so that a phosphor having a predetermined host material structure can be produced by considering the composition of respective materials in view of the host material structure of the phosphor that is the object of the production.

As described above, the produced phosphor is used in combination with an appropriate light emitting portion such as an LED. Accordingly, the phosphor is preferred to be in a powder form, which can be easily handled to be applied, filled, and so on. Here, the phosphor according to the present invention does not included aluminum which is liable to be oxidized in a composition part that is the skeletal structure of the host material structure, and it is excellent in oxidation resistance since it includes oxygen, so that the phosphor can be easily pulverized to a predetermined particle size even in an atmosphere without controlling it to be inert atmosphere or the like. Here, in view of emission efficiency, an average particle size of the phosphor is preferably 20 µm or smaller, and when the average particle size is 0.1 µm or larger, it can be easily pulverized by a publicly known pulverizing method.

The phosphor according to the present invention in a pulverized form can be used as various light sources such as an LED, CRT, and PDP (for example, as a display device and an illumination unit) by combining with a light emitting portion (particularly, a light emitting portion having a light emitting wavelength region from 300 to 550 nm).

EXAMPLES

Hereinafter, the present invention will be described more specifically based on examples.

It should be noted that, for the sake of convenience in explanation of comparison results of phosphor samples according to the present invention and phosphor samples produced in accordance with a conventional art, among consecutive numbers 1 to 39 assigned to the examples, 8, 23 and 39 are assigned not as numbers for examples but as numbers for comparison examples.

Example 1

Commercially available CaO [3N], $Si_3N_4$ [3N], and $Eu_2O_3$ [3N] are prepared, and the respective raw materials are weighed so that a mol ratio of them becomes CaO:$Si_3N_4$: $Eu_2O_3$=1.4775:1:0.01125. These weighed raw materials were mixed using a mortar inside a glove box under a nitrogen atmosphere. The mixed raw materials were filled into a melting pot made of boron nitride, heated to 1600° C. by a heating rate of 15° C./min under a nitrogen atmosphere, retained and fired at 1600° C. for three hours, and cooled down thereafter from 1600° C. to 200° C. for an hour to thereby obtain a phosphor sample. Results of chemical analysis and measurement results of an average particle size and a specific surface area of obtained phosphor powder are shown in Table 1. From the chemical analysis results, it was found that the composition formula of the phosphor sample is $Ca_{1.58}Si_3O_{1.63}N_{4.35}$:$Eu_{0.024}$.

TABLE 1

|  | Ca (%) | Si (%) | Eu (%) | N (%) | O (%) | Average particle size (D50) | Specific surface area (m²/g) |
| --- | --- | --- | --- | --- | --- | --- | --- |
| Example 1 | 26.3 | 35.0 | 1.51 | 25.3 | 10.8 | 12.78 µm | 1.93 m²/g |

Next, an emission spectrum and an excitation spectrum of the phosphor sample were measured. Results of the measurement will be explained with reference to FIG. 1 and FIG. 2. Here, in both FIG. 1 and FIG. 2, luminescence intensity of the phosphor of the present invention is taken as relative intensity on the vertical axis, and a wavelength of light is taken on the horizontal axis.

First, the emission spectrum of the phosphor sample will be explained using FIG. 1. The emission spectrum is a spectrum emitted from an object when the object is irradiated with light or energy having a certain wavelength. FIG. 1 shows a wavelength spectrum emitted from the phosphor of the present invention when the phosphor is irradiated with monochromatic light of 460 nm As is clear from FIG. 1, the phosphor sample exhibits light emission in a wide wavelength region from 500 nm to 800 nm, and exhibits the highest light emission at 609 nm. Incidentally, orange light emission color was recognized by visual observation.

Next, the excitation spectrum of the phosphor sample will be explained using FIG. 2. The excitation spectrum is a spectrum measured in such a manner that a phosphor that is a subject to be measured is excited using monochromatic light of various wavelengths, luminescence intensity with a constant wavelength of light emission from the phosphor is measured, and excitation wavelength dependency of the luminescence intensity is measured. In this measurement, the phosphor sample was irradiated with monochromatic light of from 250 to 600 nm, and excitation dependency of the luminescence intensity of light with a wavelength of 609 nm emitted from the phosphor sample was measured.

Figure 2:
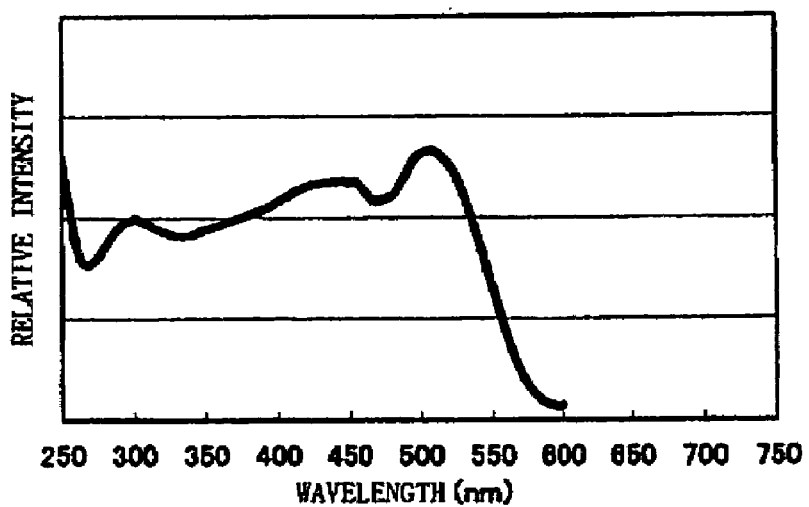
FIG. 2 is a view showing an excitation spectrum of a phosphor sample made in Example 1.

As is clear from FIG. 2, the excitation spectrum of the phosphor sample is wide, from approximately 250 nm to approximately 600 nm, and it was found that the phosphor sample exhibits high emission of orange light by a wide range of excitation light.

Examples 2 to 6

In Examples 2 to 6, phosphor samples were made and luminescence intensity was measured similarly to Example 1 except that the mixing ratio of the respective raw materials of CaO [3N], $Si_3N_4$ [3N], and $Eu_2O_3$ [3N] explained in Example 1 was changed and set as Examples 2 to 6.

Here, in Example 2, CaO:$Si_3N_4$:$Eu_2O_3$=0.073875:1: 0.005625 was set, in Example 3, CaO:$Si_3N_4$:$Eu_2O_3$=0.985: 1:0.0075 was set, in Example 4, CaO:$Si_3N_4$: $Eu_2O_3$=1.23125:1:0.009375 was set, in Example 5, CaO:

$Si_3N_4:Eu_2O_3=1.4775:1:0.01125$ was set, and in Example 6, $CaO:Si_3N_4:Eu_2O_3=1.97:1:0.015$ was set.

Measurement results of luminescence intensity of the phosphor samples according to Examples 2 to 6 are explained with reference to FIG. 3. Here, in FIG. 3, luminescence intensity of the phosphor sample is taken on the vertical axis, and a value of $CaO/Si_3N_4$, which is the raw material ratio, is taken on the horizontal axis. Note that the luminescence intensity of the phosphor samples is standardized by luminescence intensity when $CaO/Si_3N_4=1.5$ as 100%. Results of a case that the value of $CaO/Si_3N_4$ is adjusted from 0.75 to 2 are shown. Note that light having a wavelength of 460 nm was used to excite the phosphor samples.

Figure 3:
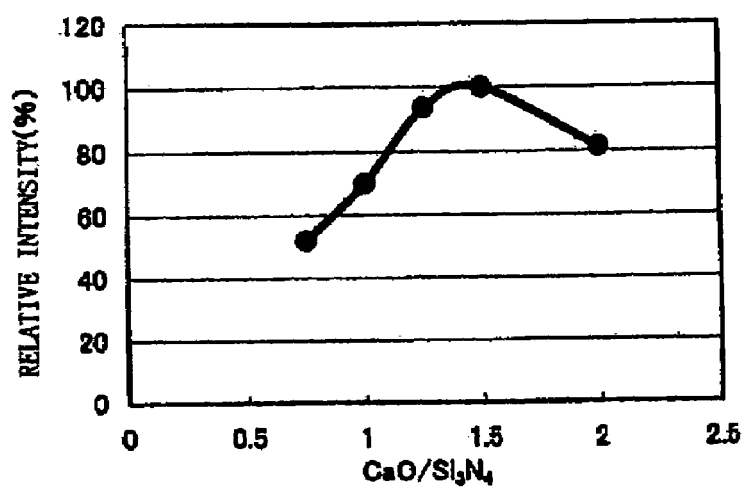
FIG. 3 is a view showing a relationship between the composition of a phosphor sample according to the present invention and luminescence intensity.

As is clear from the results in FIG. 3, the luminescence intensity increased as the value of $CaO/Si_3N_4$ increased in a range of the value of $CaO/Si_3N_4$ from 0.7 to 1.5, and the maximum luminescence intensity was exhibited when $CaO/Si_3N_4=1.5$.

In addition, in parallel to the measurement results of the luminescence intensity, chromaticity coordinates (x, y) of light emission of the phosphor sample is also measured. Results of the measurement are shown in Table 2.

TABLE 2

| | | | | Ex: 460 nm | |
|---|---|---|---|---|---|
| | $CaO/Si_3N_4$ | Firing condition | Relative intentisy | Emission maximum | x | y |
| Example 2 | 0.75 | 1600° C. × 3 h | 52.1% | 605.6 | 0.576 | 0.420 |
| Example 3 | 1 | 1600° C. × 3 h | 70.0% | 608.1 | 0.580 | 0.417 |
| Example 4 | 1.25 | 1600° C. × 3 h | 93.7% | 608.9 | 0.584 | 0.414 |
| Example 5 | 1.5 | 1600° C. × 3 h | 100% | 609.3 | 0.589 | 0.409 |
| Example 6 | 2 | 1600° C. × 3 h | 81.4% | 610.2 | 0.600 | 0.399 |

Example 7

An LED of ultraviolet light having a nitride semiconductor as a light emitting portion was used, the phosphor sample obtained in Example 2, a commercially available blue phosphor (BAM:Eu), and a commercially available green phosphor (ZnS:Cu, Al) were applied on the LED, and the LED of ultraviolet light was illuminated. Then, the respective phosphors emitted light by light from the LED, and an LED which emits white light when visually observed was obtained.

Further, on an LED of blue light having a nitride semiconductor as a light emitting portion, the phosphor sample obtained by the present invention and a commercially available yellow phosphor (YAG:Ce) were applied, and the LED of blue light was illuminated. Then, the respective phosphors emitted light by light from the LED, and an LED which emits white light when visually observed was obtained.

Comparison Example 8

In Comparison Example 8, the $Ca_2Si_5N_8$:Eu phosphor disclosed in Patent Documents 5 and 6 was produced as a sample according to Comparison Example and compared with the phosphor sample according to Example 1 of the present invention.

For the $Ca_2Si_5N_8$:Eu phosphor used as the comparison example, [2N] or [3N] reagents of $Ca_3N_2$, $Si_3N_4$, and $Eu_2O_3$ were prepared as raw materials, and the respective raw materials were weighed so that a compounding ratio of $Ca_3N_2$, $Si_3N_4$, and $Eu_2O_3$ becomes a mol ratio of Ca:Si:Eu=1.97:5:0.03. The raw materials after the weighing were mixed using a mortar inside a glove box under a nitrogen atmosphere. At this time, adequate attention was paid so as not to oxidize the raw material unnecessarily. The mixed raw materials are filled into a melting pot made of boron nitride, and they are fired at 1500° C. in nitrogen for three hours and then cooled down similarly to Example 1, while paying attention so as not to oxidize the raw materials, and so as to completely remove the oxygen in the raw materials. After the raw materials were completely cooled down, they were pulverized while paying attention so as not to oxidize them to thereby obtain the phosphor sample according to the comparison example. A chemical analysis was performed on the composition of the produced phosphor sample, and then the sample had a composition formula of $Ca_{1.97}Si_5N_8:Eu_{0.03}$.

Emission spectra of both the phosphor samples of Comparison Example and Example 1 were measured and compared similarly to Example 1. However, monochromatic light of 460 nm was used as the light to be irradiated. Results of the measurement are shown in FIG. 4 and Table 3.

Figure 4:
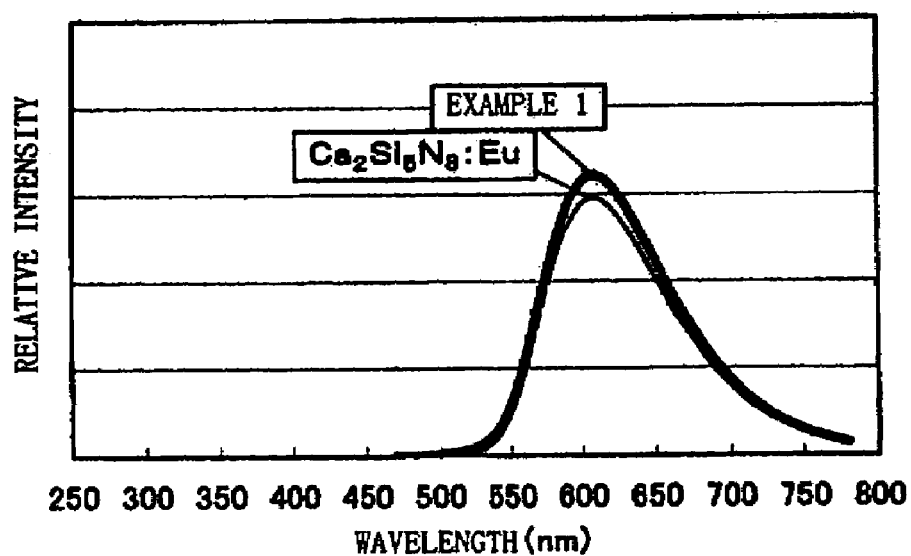
FIG. 4 is a view showing emission spectra of phosphor samples according to the present invention and a conventional art.

FIG. 4 is a graph similar to FIG. 1, which shows the emission spectrum of the phosphor sample according to the present invention by a thick solid line, and the emission spectrum of the phosphor sample according to Comparison Example is shown by a thin solid line.

As is clear from the results in FIG. 4 and Table 3, the phosphor sample according to Example 1 has approximately 9% higher relative intentisy as compared to the phosphor sample of the composition formula $Ca_{1.97}Si_5N_8:Eu_{0.03}$ according to Comparison Example, and therefore it was found to be a phosphor that is easy to produce and has high efficiency.

TABLE 3

| | Excitation wavelength | Firing condition | Relative intentisy | Emission maximum | x | y |
|---|---|---|---|---|---|---|
| Example 1 | 460 nm | 1600° C. × 3 h | 109.2% | 609.3 | 0.589 | 0.409 |
| $Ca_{1.97}Si_5N_8:Eu_{0.03}$ | 460 nm | 1500° C. × 3 h | 100% | 609.2 | 0.593 | 0.405 |

Example 9

Commercially available CaO [3N], $Si_3N_4$ [3N], and $Eu_2O_3$ [3N] were prepared, and the respective materials were weighed so that a mol ratio of them becomes $CaO:Si_3N_4:Eu_2O_3=1.23125:1:0.009375$. These weighed raw materials were mixed using a mortar inside a glove box under a nitrogen atmosphere. The mixed raw materials were filled into a melting pot made of boron nitride, heated to 1600° C. by a heating rate of 15° C./min in the nitrogen atmosphere, retained and fired at 1600° C. for 24 hours, and cooled down thereafter from 1600° C. to 200° C. for an hour to thereby obtain a phosphor sample. Results of a chemical analysis and measurement results of an average particle size and a specific surface area of the obtained phosphor powder are shown in Table 4. From the chemical analysis results, it was found that the composition formula of the phosphor sample is $Ca_{1.42}Si_3O_{1.12}N_{4.27}:Eu_{0.021}$.

Next, an emission spectrum and an excitation spectrum of the phosphor sample were measured similarly to Example 1. Results of the measurement will be explained with reference to FIG. 5 and FIG. 6. Here, in both FIG. 5 and FIG. 6, luminescence intensity of the phosphor of the present invention is taken as relative intensity on the vertical axis, and a wavelength of light is taken on the horizontal axis.

Figure 5:
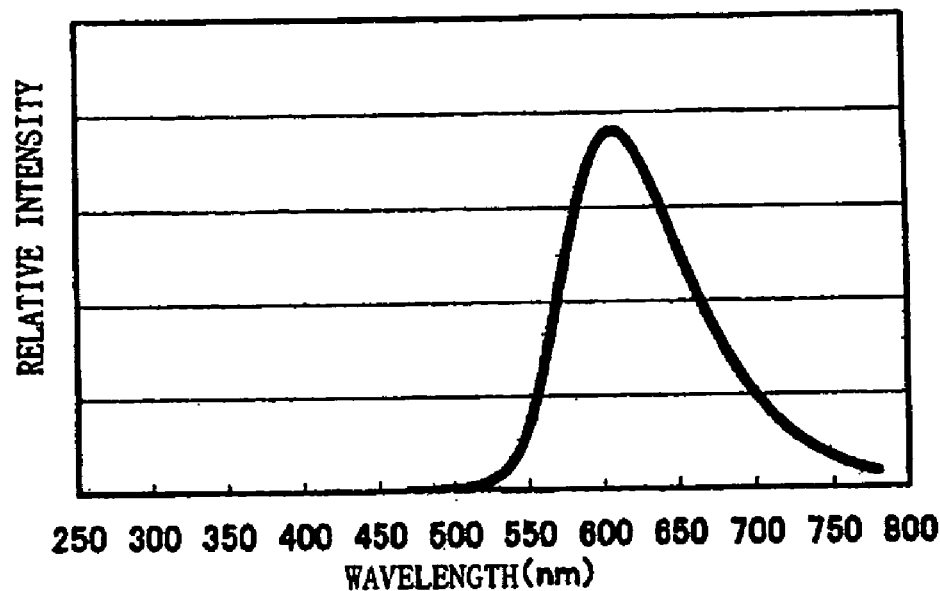
FIG. 5 is a view showing an emission spectrum of a phosphor sample made in Example 9.
Figure 6:
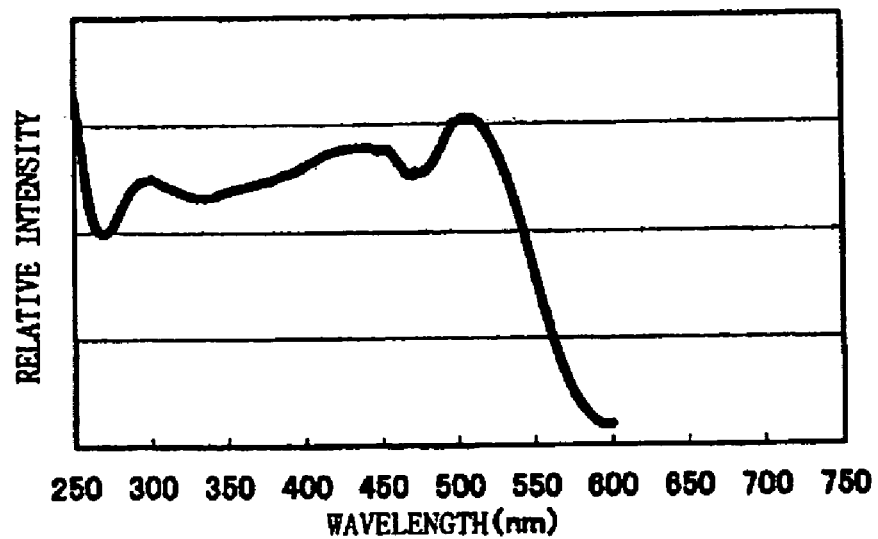
FIG. 6 is a view showing an excitation spectrum of the phosphor sample made in Example 9.

As is clear from FIG. 5, the phosphor sample exhibits light emission in a wide wavelength region from 500 nm to 800 nm, and exhibits the highest light emission at 608 nm. Incidentally, orange light emission color was recognized by visual observation.

Next, the excitation spectrum of the phosphor sample was measured, but in this measurement, the phosphor of the present invention was irradiated with monochromatic light of from 250 to 600 nm, and excitation dependency of the luminescence intensity of light with a wavelength of 608 nm emitted from the sample was measured. As is clear from FIG. 6, the excitation spectrum of the phosphor sample is wide, from approximately 250 mm to approximately 600 nm, and it was found that the phosphor sample exhibits high emission of orange light in a wide range.

TABLE 4

| | Ca (%) | Si (%) | Eu (%) | N (%) | O (%) | Average particle size (D50) | Specific surface area (m²/g) |
|---|---|---|---|---|---|---|---|
| Example 9 | 24.5 | 36.4 | 1.37 | 25.8 | 7.77 | 9.46 μm | 1.92 m²/g |

Examples 10 to 16

In Examples 10 to 16, commercially available CaO [3N], $Si_3N_4$ [3N], and $Eu_2O_3$ [3N] were prepared similarly to Example 9, and except that a mol ratio of them is set to predetermined values to weigh raw materials of respective phosphor samples, phosphor samples were made and luminescence intensity of the phosphor samples was measured similarly to Example 9.

Here, in Example 10, $CaO:Si_3N_4:Eu_2O_3=1.0835:1:0.00825$ is set, in Example 11, $CaO:Si_3N_4:Eu_2O_3=1.13275:1:0.008625$ is set, in Example 12, $CaO:Si_3N_4:Eu_2O_3=1.182:1:0.009$ is set, in Example 13, $CaO:Si_3N_4:Eu_2O_3=1.23125:1:0.009375$ is set, in Example 14, $CaO:Si_3N_4:Eu_2O_3=1.2805:1:0.00975$ is set, in Example 15, $CaO:Si_3N_4:Eu_{263}=1.4775:1:0.01125$ is set, and in Example 16, $CaO:Si_3N_4:Eu_2O_3=1.72375:1:0.013125$ is set.

Measurement results of luminescence intensity will be explained with reference to FIG. 7. Here, in FIG. 7, luminescence intensity of the phosphor according to the present invention is taken on the vertical axis, and a value of $CaO/Si_3N_4$, which is the raw material ratio, is taken on the horizontal axis. Note that, regarding the luminescence intensity, luminescence intensity when $CaO/Si_3N_4=1.25$ is set as 100%. Results of adjusting the value of $CaO/Si_3N_4$ from 1.1 to 1.75 are shown. Note that light having a wavelength of 460 nm is used for excitation.

Figure 7:
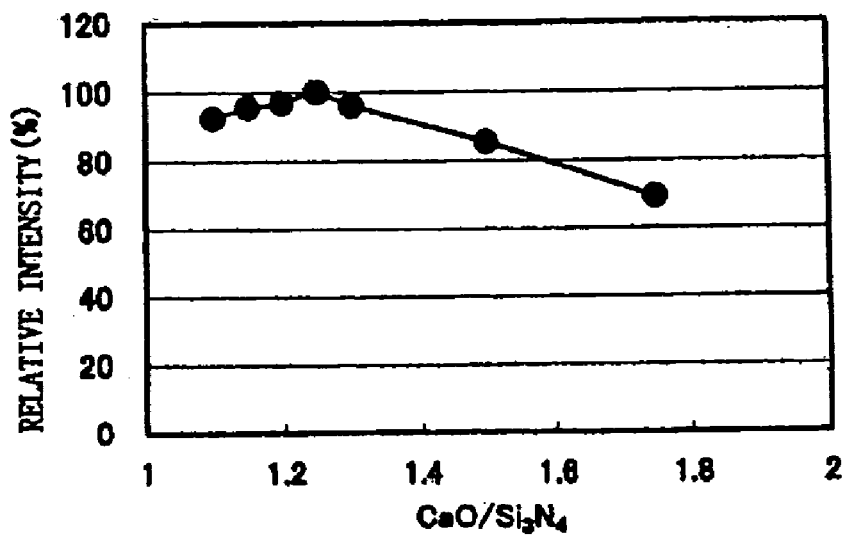
FIG. 7 is a view showing a relationship between the composition of a phosphor sample according to the present invention and luminescence intensity.

As is clear from the results in FIG. 7, the maximum luminescence intensity was exhibited when $CaO/Si_3N_4=1.25$.

In addition, in parallel to the measurement results of the luminescence intensity, chromaticity coordinates (x, y) of the light emission was also measured. Results of the measurement are shown in Table 5.

TABLE 5

| | $CaO/Si_3N_4$ | Firing condition | Relative intensity | Emission max- imum | Ex: 460 nm x | y |
|---|---|---|---|---|---|---|
| Example 10 | 1.1 | 1600° C. × 24 h | 92.6% | 608.2 | 0.588 | 0.410 |
| Example 11 | 1.15 | 1600° C. × 24 h | 95.7% | 605.7 | 0.588 | 0.410 |
| Example 12 | 1.2 | 1600° C. × 24 h | 96.9% | 607.8 | 0.589 | 0.409 |
| Example 13 | 1.25 | 1600° C. × 24 h | 100% | 608.4 | 0.590 | 0.408 |
| Example 14 | 1.3 | 1600° C. × 24 h | 96.2% | 608.1 | 0.590 | 0.408 |
| Example 15 | 1.5 | 1600° C. × 24 h | 85.5% | 609.3 | 0.595 | 0.404 |
| Example 16 | 1.75 | 1600° C. × 24 h | 69.2% | 609.4 | 0.598 | 0.400 |

Examples 17 to 21

In Examples 17 to 21, the phosphor sample according to Example 13 was used to measure luminescence intensity due to concentration of activator Eu element.

Here, in Example 17, $CaO:Si_3N_4:Eu_2O_3=1.24875:1:0.000625$ is set, in Example 18, $CaO:Si_3N_4:Eu_2O_3=1.24375:1:0.003125$ is set, in Example 19, $CaO:Si_3N_4:Eu_2O_3=1.23125:1:0.009375$ is set, in Example 20, $CaO:Si_3N_4:Eu_2O_3=1.2125:1:0.01875$ is set, and in Example 21, $CaO:Si_3N_4:Eu_2O_3=1.1875:1:0.03125$ is set.

Results of the measurement will be explained with reference to FIG. 8. Here, in FIG. 8, luminescence intensity of the phosphor according to the present invention is taken on the vertical axis, and a percentage of Eu inside a Ca site, in other words, a value of $Eu/(Ca+Eu)$ is taken on the horizontal axis. Note that, regarding the luminescence intensity, luminescence intensity when a sample of $Eu/(Ca+Eu)=0.03$ is excited by light of 460 nm is set as 100%. Results of adjusting a value of $Eu/(Ca+Eu)$ from 0.001 to 0.05 are shown. Note that light having a wavelength of 460 mm was used for excitation.

Figure 8:
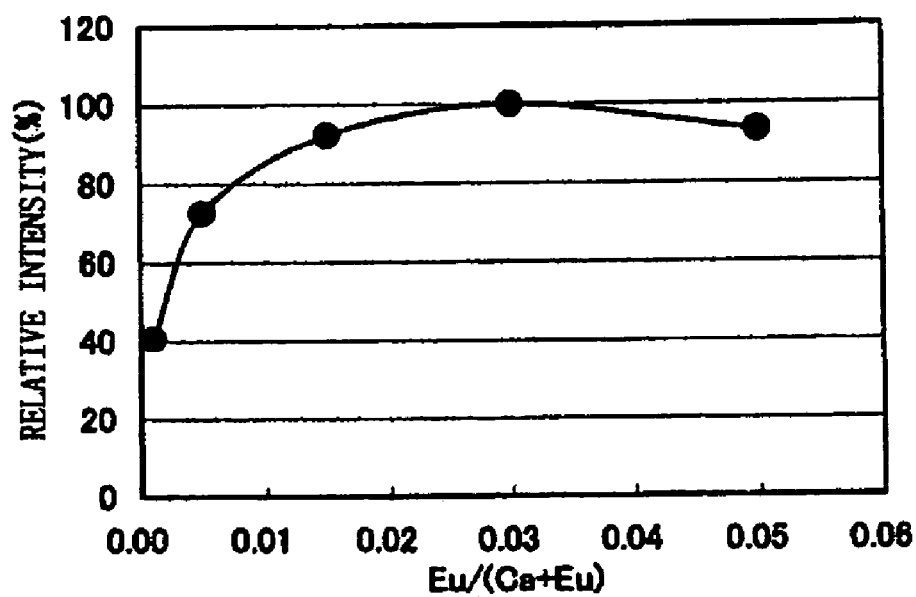
FIG. 8 is a view showing a relationship between an Eu addition amount and luminescence intensity in a phosphor sample according to the present invention.

As is clear from the results in FIG. 8, the luminescence intensity first rises with increase of the value of $Eu/(Ca+Eu)$, but the luminescence intensity starts to decrease at a peak of approximately 0.03. A conceivable reason of this is that, at a portion where the value is less than 0.03, the luminescence intensity is low because the activator element is not sufficient, and at a portion where the value is more than 0.03, there occurs concentration quenching caused by the activator element.

In addition, in parallel to the measurement of the luminescence intensity, chromaticity coordinates (x, y) of the light emission of the phosphor sample was also measured. Results of the measurement are shown in Table 6. As is clear from the results in Table 6, it was confirmed that as the value of $Eu/(Ca+Eu)$ increases, an emission maximum also shifts to a longer wavelength side.

TABLE 6

|  | $CaO/Si_3N_4$ | Eu/(Ca + Eu) | Firing condition | Relative intentisy | Emission maximum | x | y |
|---|---|---|---|---|---|---|---|
| Example 17 | 1.25 | 0.001 | 1600° C. × 24 h | 40.6% | 604.6 | 0.575 | 0.422 |
| Example 18 | 1.25 | 0.005 | 1600° C. × 24 h | 72.6% | 605.7 | 0.582 | 0.416 |
| Example 19 | 1.25 | 0.015 | 1600° C. × 24 h | 92.2% | 608.1 | 0.590 | 0.408 |
| Example 20 | 1.25 | 0.03 | 1600° C. × 24 h | 100% | 610.2 | 0.597 | 0.401 |
| Example 21 | 1.25 | 0.05 | 1600° C. × 24 h | 93.5% | 614.4 | 0.603 | 0.395 |

Example 22

Figure 9:
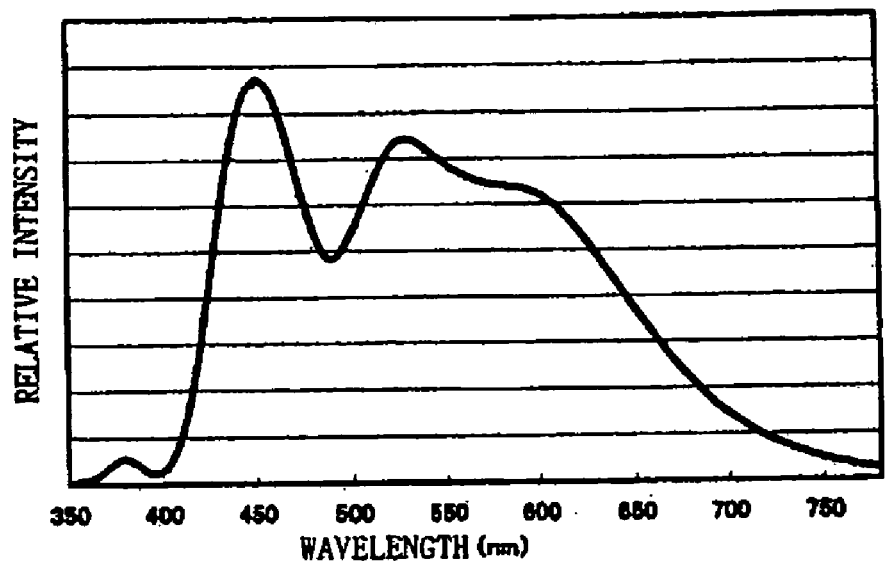
FIG. 9 is a view showing an emission spectrum of an LED made in Example 22.

On an LED of ultraviolet light having a nitride semiconductor as a light emitting portion, the phosphor sample obtained in Example 9, a commercially available blue phosphor (BAM:Eu), and a commercially available green phosphor (ZnS:Cu, Al) were applied, and the LED of ultraviolet light was illuminated. Then, the respective phosphors emitted light by light from the LED, and an LED which appears to be white when visually observed was obtained. Results of measuring an emission spectrum of the obtained LED are shown in FIG. 9. Further, light emission of various colors was obtained by appropriately changing compounding amounts of the phosphors.

Further, on an LED of blue light having a nitride semiconductor as a light emitting portion, the phosphor sample obtained in the present invention and a commercially available yellow phosphor (YAG:Ce) were applied, and the LED of blue light was illuminated. Then, the respective phosphors emitted light by light from the LED, and an LED which appears to be white when visually observed was obtained. Further, in a case that a commercially available green phosphor (ZnS:Cu, Al) was used instead of the yellow phosphor, an LED which appears to be white when visually observed was obtained.

Comparison Example 23

In Comparison Example 23, the $Ca_2Si_5N_8$:Eu phosphor disclosed in Patent Documents 5 and 6 was produced as a sample according to Comparison Example and compared with the phosphor sample according to Example 9 of the present invention. Incidentally, the $Ca_2Si_5N_8$:Eu phosphor sample used in this Comparison Example was produced in accordance with the method described in Comparison Example 8.

Emission spectra of both the phosphor samples were measured and compared similarly to Example 9. However, monochromatic light of 460 nm was used as the light to be irradiated. Results of the measurement are shown in FIG. 10 and Table 7.

Figure 10:
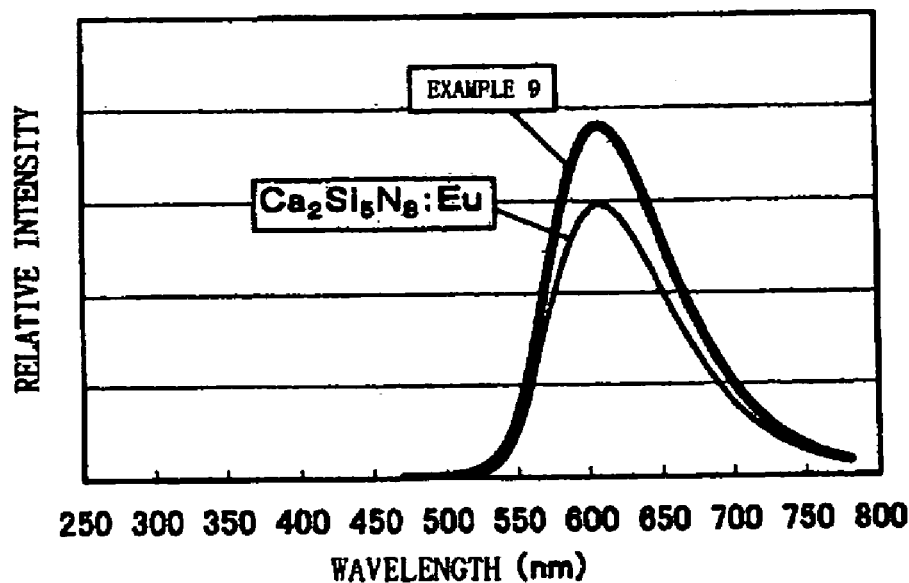
FIG. 10 is a view showing emission spectra of phosphor samples according to the present invention and the conventional art.

The vertical axis and the horizontal axis in FIG. 10 are same as those of the graph in FIG. 5. Here, an emission spectrum of the phosphor sample according to the present invention is shown by a thick solid line, and the emission spectrum of the phosphor sample of a composition formula $Ca_{1.97}Si_5N_8Si:Eu_{0.03}$ is shown by a thin solid line.

As is clear from the results in FIG. 10 and Table 7, the phosphor sample according to Example 9 has approximately 29% higher relative intentisy as compared to the phosphor sample of the composition formula $Ca_{0.97}Si_5N_8:Eu_{0.03}$, and therefore it was found to be a phosphor with remarkably high efficiency.

TABLE 7

|  | Excitation wavelength | Firing condition | Relative intentisy | Emission maximum | x | y |
|---|---|---|---|---|---|---|
| Example 9 | 460 nm | 1600° C. × 24 h | 128.9% | 608.4 | 0.590 | 0.408 |
| $Ca_{1.97}Si_5N_8:Eu_{0.03}$ | 460 nm | 1500° C. × 3 h | 100% | 609.2 | 0.593 | 0.405 |

Example 24

Commercially available $SrCO_3$ [3N], $Si_3N_4$ [3N], and $Eu_2O_3$ [3N] were prepared, and respective raw materials were weighed so that a mol ratio of them becomes $SrCO_3$:$Si_3N_4$:$Eu_2O_3$=2.70875:1:0.020625. These weighed raw materials were mixed using a mortar inside a glove box under a nitrogen atmosphere. The mixed raw materials were filled into a melting pot made of boron nitride, heated to 1600° C. by a heating rate of 15° C./min in the nitrogen atmosphere, retained and fired at 1600° C. for 3 hours, and cooled down thereafter from 1600° C. to 200° C. for an hour to thereby obtain a phosphor sample. Results of a chemical analysis and measurement results of an average particle size and a specific surface area of the obtained phosphor powder are shown in Table 8. From the chemical analysis results, it was found that the composition formula of the phosphor sample is $Sr_{2.9}Si_3O_{4.17}N_{3.28}:Eu_{0.044}$.

TABLE 8

|  | Sr (%) | Si (%) | Eu (%) | N (%) | O (%) | Average particle size (D50) | Specific surface area (m²/g) |
|---|---|---|---|---|---|---|---|
| Example 24 | 53.3 | 17.7 | 1.41 | 9.64 | 14.0 | 3.23 μm | 1.73 m²/g |

Next, an emission spectrum and an excitation spectrum of the phosphor sample were measured similarly to Example 1. Results of the measurement will be explained with reference to FIG. 11 and FIG. 12. Here, in both FIG. 11 and FIG. 12, luminescence intensity of the phosphor of the present invention is taken as relative intensity on the vertical axis, and a wavelength of light is taken on the horizontal axis.

Figure 11:
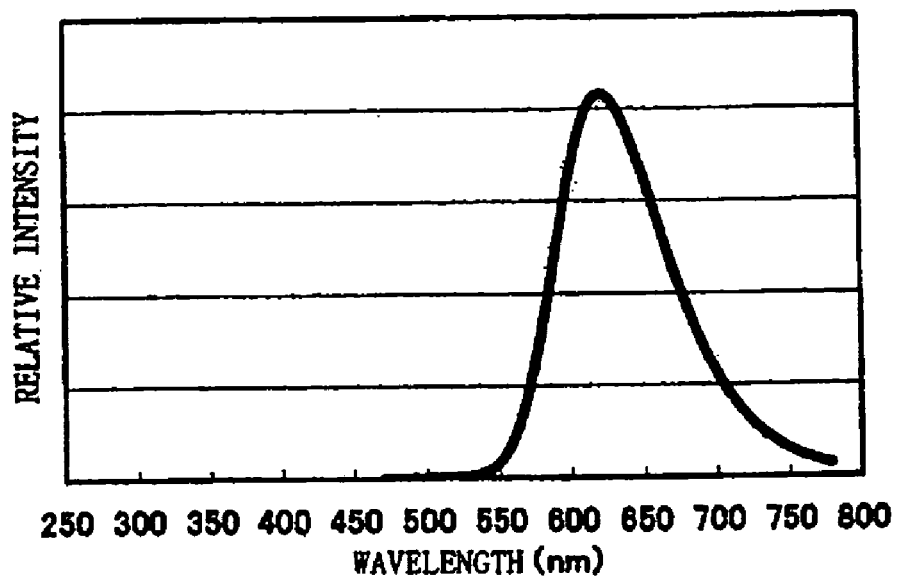
FIG. 11 is a view showing an emission spectrum of a phosphor sample made in Example 24.
Figure 12:
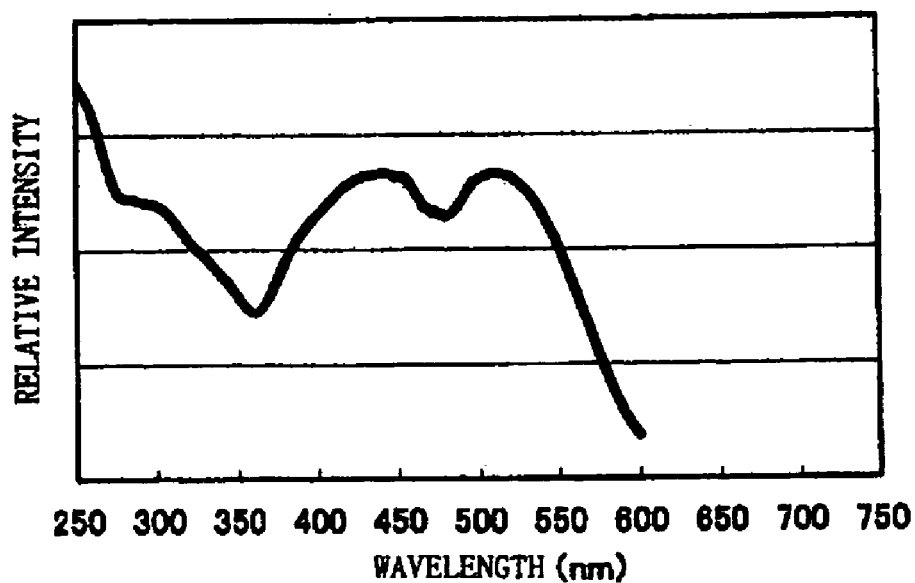
FIG. 12 is a view showing an excitation spectrum of the phosphor sample made in Example 24.

As is clear from FIG. 11, the phosphor sample exhibits light emission in a wide wavelength region from 500 nm to 800 nm, and exhibits the highest light emission at 624 nm. Incidentally, orange light emission color was recognized by visual observation.

Next, the excitation spectrum of the phosphor sample was measured, but in this measurement, the phosphor of the present invention was irradiated with monochromatic light of from 250 to 600 nm, and excitation dependency of the luminescence intensity of light with a wavelength of 624 nm emitted from the sample was measured. As is clear from FIG. 12, the excitation spectrum of the phosphor sample is wide, from approximately 250 mm to approximately 600 nm, and it was found that the phosphor sample exhibits high emission of orange light in a wide range.

Examples 25 to 32

In Examples 25 to 32, commercially available $SrCO_3$ [3N], $Si_3N_4$ [3N], and $Eu_2O_3$ [3N] were prepared similarly to Example 24, and except that a mol ratio of them is set to predetermined values to weigh raw materials of respective phosphor samples, phosphor samples were made and luminescence intensity of the phosphor samples was measured similarly to Example 24.

Here, in Example 25, $SrCO_3:Si_3N_4:Eu_2O_3$=1.23125:1:0.009375 is set, in Example 26, $SrCO_3:Si_3N_4:Eu_2O_3$=1.775:1:0.01125 is set, in Example 27, $SrCO_3:Si_3N_4:Eu_2O_3$=1.72375:1:0.013125 is set, in Example 28, $SrCO_3:Si_3N_4:Eu_2O_3$=1.97:1:0.015 is set, in Example 29, $SrCO_3:Si_3N_4:Eu_2O_3$=2.21625:1:0.016875 is set, in Example 30, $SrCO_3:Si_3N_4:Eu_2O_3$=2.4625:1:0.01875 is set, in Example 31, $SrCO_3:Si_3N_4:Eu_2O_3$=2.70875:1:0.020625 is set, and in Example 32, $SrCO_3:Si_3N_4:Eu_2O_3$=2.955:1:0.0225 is set.

Results of the measurement will be explained with reference to FIG. 13. Here, in FIG. 13, luminescence intensity of the phosphor sample according to the present invention is taken on the vertical axis, and a value of $SrCO_3/Si_3N_4$ is taken on the horizontal axis. Note that, regarding the luminescence intensity, luminescence intensity when $SrCO_3/Si_3N_4$=2.75 is set as 100%. Results of adjusting the value of $SrCO_3/Si_3N_4$ from 1.25 to 3 are shown. Note that light having a wavelength of 460 nm is used for excitation.

Figure 13:
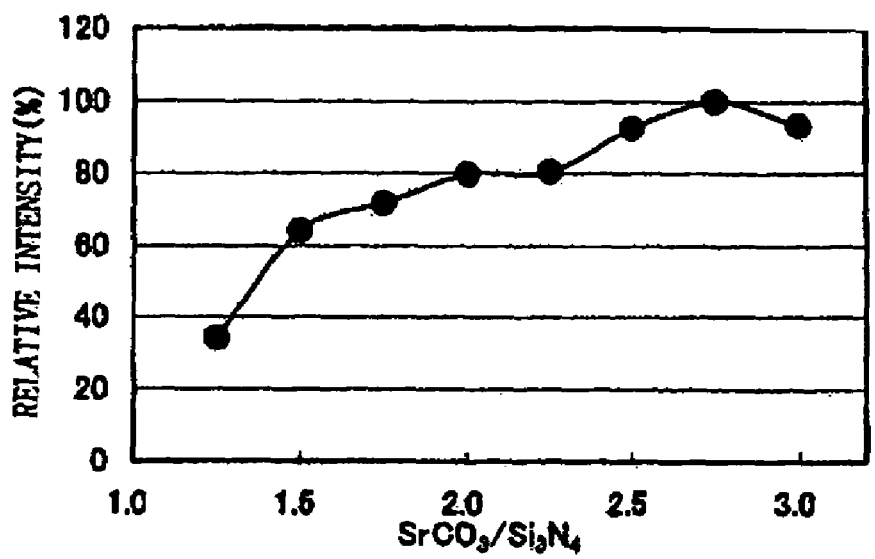
FIG. 13 is a view showing a relationship between the composition of a phosphor sample according to the present invention and luminescence intensity.

As is clear from the results in FIG. 13, the luminescence intensity first rose with increase of the value of $SrCO_3/Si_3N_4$, and the maximum luminescence intensity was exhibited when $SrCO_3/Si_3N_4$=2.75.

In addition, in parallel to the measurement of the luminescence intensity, chromaticity coordinates (x, y) of the light emission is also measured. Results of the measurement are shown in Table 9.

TABLE 9

| | $SrCO_3/Si_3N_4$ | Firing condition | Relative intentisy | Ex: 460 nm Emission maximum | x | y |
|---|---|---|---|---|---|---|
| Example 25 | 1.25 | 1600° C. × 3 h | 34.1% | 625.4 | 0.571 | 0.418 |
| Example 26 | 1.5 | 1600° C. × 3 h | 64.2% | 621.3 | 0.603 | 0.393 |
| Example 27 | 1.75 | 1600° C. × 3 h | 71.8% | 622.4 | 0.612 | 0.385 |

TABLE 9-continued

| | $SrCO_3/Si_3N_4$ | Firing condition | Relative intentisy | Ex: 460 nm Emission maximum | x | y |
|---|---|---|---|---|---|---|
| Example 28 | 2 | 1600° C. × 3 h | 79.8% | 622.1 | 0.619 | 0.379 |
| Example 29 | 2.25 | 1600° C. × 3 h | 80.5% | 624.1 | 0.626 | 0.373 |
| Example 30 | 2.5 | 1600° C. × 3 h | 92.6% | 624.5 | 0.631 | 0.368 |
| Example 31 | 2.75 | 1600° C. × 3 h | 100% | 624.1 | 0.631 | 0.368 |
| Example 32 | 3 | 1600° C. × 3 h | 93.5% | 620.7 | 0.631 | 0.369 |

Examples 33 to 37

In Examples 33 to 37, the phosphor sample according to Example 31 was used to measure luminescence intensity due to concentration of activator Eu element.

Here, in Example 33, $SrCO_3:Si_3N_4:Eu_2O_3$=2.74725:1:0.001375 is set, in Example 34, $SrCO_3:Si_3N_4:Eu_2O_3$=2.73625:1:0.006875 is set, in Example 35, $SrCO_3:Si_3N_4:Eu_{23}$=2.70875:1:0.020625 is set, in Example 36, $SrCO_3:Si_3N_4:Eu_2O_3$=2.6675:1:0.04125 is set, and in Example 37, $SrCO_3:Si_3N_4:Eu_2O_3$=2.6125:1:0.06875 is set.

Results of the measurement will be explained with reference to FIG. 14. Here, in FIG. 14, luminescence intensity of the phosphor according to the present invention is taken on the vertical axis, and a percentage of Eu inside an Sr site, in other words, a value of Eu/(Sr+Eu) is taken on the horizontal axis. Note that, regarding the luminescence intensity, luminescence intensity when a sample of Eu/(Sr+Eu)=0.015 is excited by light of 460 nm is set as 100%. Then, results of adjusting a value of Eu/(Sr+Eu) from 0.001 to 0.05 are shown. Note that light having a wavelength of 460 nm was used for excitation.

Figure 14:
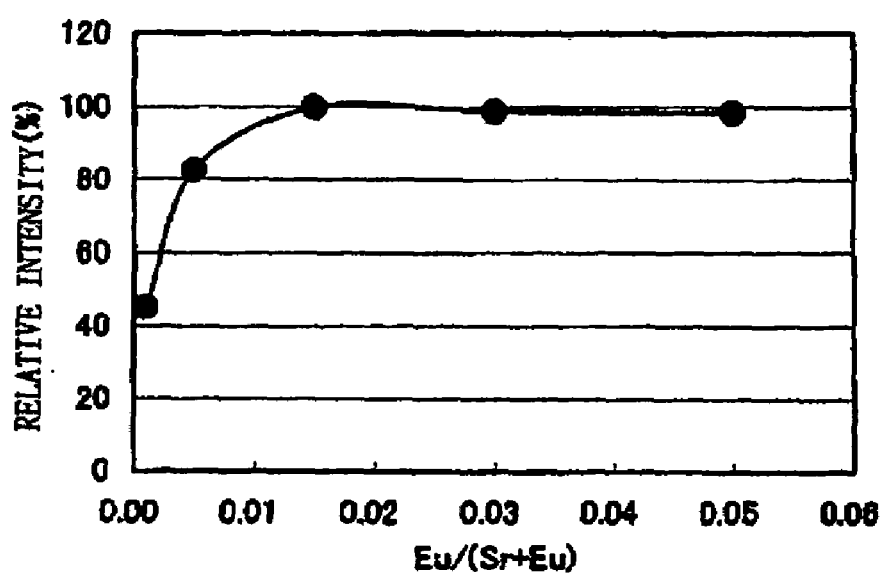
FIG. 14 is a view showing a relationship between an Eu addition amount and luminescence intensity in a phosphor sample according to the present invention.

As is clear from the results in FIG. 14, the luminescence intensity first rises with increase of the value of Eu/(Sr+Eu), but the luminescence intensity starts to decrease at a peak of approximately 0.015. A conceivable reason of this is that, at a portion where the value is less than 0.015, the luminescence intensity is low because the activator element is not sufficient, and at a portion where the value is more than 0.015, there occurs concentration quenching caused by the activator element.

In addition, in parallel to the measurement of the luminescence intensity, chromaticity coordinates (x, y) of the light emission was also measured. Results of the measurement are shown in Table 10. As is clear from the results in Table 10, it was confirmed that, as the value of Eu/(Sr+Eu) increases, an emission maximum also shifts to a longer wavelength side.

TABLE 10

|  | $SrCO_3/Si_3N_4$ | Eu/ (Ca + Eu) | Firing condition | Relative intentisy | Emission maximum | x | y |
|---|---|---|---|---|---|---|---|
| Example 33 | 2.75 | 0.001 | 1600° C. × 3 h | 45.2% | 610.4 | 0.603 | 0.395 |
| Example 34 | 2.75 | 0.005 | 1600° C. × 3 h | 82.6% | 615.4 | 0.618 | 0.381 |
| Example 35 | 2.75 | 0.015 | 1600° C. × 3 h | 100% | 622.2 | 0.632 | 0.367 |
| Example 36 | 2.75 | 0.03 | 1600° C. × 3 h | 98.8% | 631.2 | 0.642 | 0.357 |
| Example 37 | 2.75 | 0.05 | 1600° C. × 3 h | 98.4% | 638.6 | 0.651 | 0.348 |

Example 38

Figure 15:
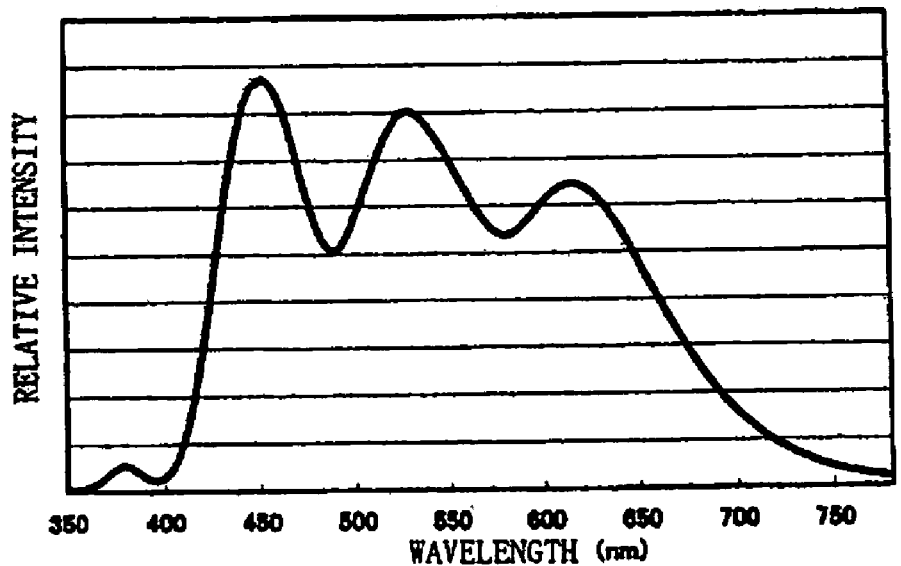
FIG. 15 is a view showing an emission spectrum of an LED made in Example 38.

On an LED of ultraviolet light having a nitride semiconductor as a light emitting portion, the phosphor sample obtained in Example 24, a commercially available blue phosphor (BAM:Eu), and a commercially available green phosphor (ZnS:Cu, Al) were applied, and the LED of ultraviolet light was illuminated. Then, the respective phosphors emitted light by light from the LED, and an LED which appears to be white when visually observed was obtained. Results of measuring an emission spectrum of the obtained LED are shown in FIG. 15. Further, light emission of various colors was obtained by appropriately changing compounding amounts of the phosphors.

Further, on an LED of blue light having a nitride semiconductor as a light emitting portion, the phosphor sample obtained in the present invention and a commercially available yellow phosphor (YAG:Ce) were applied, and the LED of blue light was illuminated. Then, the respective phosphors emitted light by light from the LED, and an LED which appears to be white when visually observed was obtained. Further, in a case that a commercially available green phosphor (ZnS:Cu, Al) was used instead of the yellow phosphor, an LED which appears to be white when visually observed was obtained.

Comparison Example 39

In Comparison Example, the $Ca_2Si_5N_8$:Eu phosphor disclosed in Patent Documents 5 and 6 was produced as a sample according to Comparison Example and compared with the phosphor sample according to Example 24 of the present invention. Incidentally, the $Ca_2Si_5N_8$:Eu phosphor used in this Comparison Example was produced in accordance with the method described in Comparison Example 8.

Emission spectra of both the phosphor samples were measured and compared similarly to Example 24. However, monochromatic light of 460 nm was used as the light to be irradiated. Results of the measurement are shown in FIG. 16 and Table 11.

Figure 16:
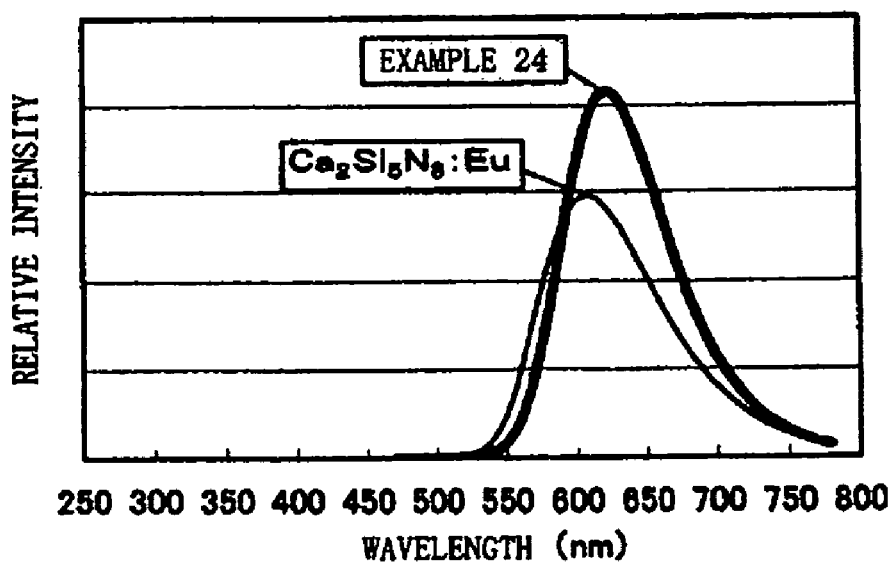
FIG. 16 is a view showing emission spectra of phosphor samples according to the present invention and the conventional art.

The vertical axis and the horizontal axis in FIG. 16 are same as those of the graph in FIG. 11. Here, an emission spectrum of the phosphor according to the present invention is shown by a thick solid line, and the emission spectrum of the phosphor of a composition formula $Ca_{1.97}Si_5N_8$:$Eu_{0.03}$ is shown by a thin solid line.

As is clear from the results in FIG. 16 and Table 11, the phosphor according to the present invention has approximately 41% higher relative intentisy as compared to the phosphor of the composition formula $Ca_{1.97}Si_5N_8$:$Eu_{0.03}$, and therefore it was found to be a phosphor with remarkably high efficiency.

TABLE 11

|  | Excitation wavelength | Firing condition | Relative intentisy | Emission maximum | x | y |
|---|---|---|---|---|---|---|
| Example 24 | 460 nm | 1600° C. × 3 h | 140.9% | 624.1 | 0.631 | 0.368 |
| $Ca_{1.97}Si_5N_8$:$Eu_{0.03}$ | 460 nm | 1500° C. × 3 h | 100% | 609.2 | 0.593 | 0.405 |

What is claimed is:

1. A phosphor represented by a general formula $M_{a+p}Si_3O_{a+q}N_{4+r}$:Z, wherein M is a divalent element, Z is an element to be an activator, "a" is in a range of $0<a\leq10$, "p" is in a range of $-a/2<p<a/2$, "q" is in a range of $-a/2<q<2a$, and "r" is in a range of $-2<r<2$.

2. The phosphor according to claim 1, wherein M is at least one or more elements selected from the group consisting of beryllium, magnesium, calcium, strontium, barium, zinc, cadmium, and mercury, and Z is at least one or more elements selected from rare-earth elements or transition metal elements.

3. The phosphor according to claim 1, wherein "a" is in a range of $0<a\leq6$.

4. The phosphor according to claim 1, wherein M is at least one or more elements selected from the group consisting of magnesium, calcium, strontium, barium, and zinc.

5. The phosphor according to claim 1, wherein Z is at least one or more elements selected from the group consisting of europium, manganese, and cerium.

6. The phosphor according to claim 1, wherein Z is europium.

7. The phosphor according to claim 1, wherein M is calcium.

8. The phosphor according to claim 1, wherein M is strontium.

9. The phosphor according to claim 1, wherein Z content is 0.0001 mol or more and 0.5 mol or less when the corresponding M is one mol.

10. The phosphor according to claim 1, wherein said phosphor is in a powder form.

11. The phosphor according to claim 10, wherein an average particle size of said phosphor is 20 μm or less and 0.1 μm or more.

12. A production method of a phosphor which is represented by a general formula $M_{a+p}Si_3O_{a+q}N_{4+r}$:Z, in which M is a divalent element, Z is an element to be an activator, "a" is in a range of $0<a\leq10$, "p" is in a range of $-a/2<p<a/2$, "q" is in a range of $-a/2<q<2a$, and "r" is a $-2<r<2$, wherein one or more kind selected from an oxide, a carbonate, a nitride, a hydroxide, and a basic carbonate of M is used as a raw material of M, a silicon dioxide and/or a silicon nitride are/is used as a raw material of the silicon, and a silicon nitride and/or a nitride of M are/is used as a raw material of N, comprising the steps of:

mixing these raw materials to manufacture a mixture; and
firing the mixture thus obtained.

13. A light source, comprising:
a phosphor according to claim 1; and
a light emitting portion.

14. The light source according to claim 13, wherein a wavelength of light emitted by said light emitting portion is from 300 nanometers to 550 nanometers.

15. A light emitting diode, comprising:
a phosphor according to claim 1; and
a light emitting portion.

16. The light emitting diode according to claim 15, wherein a wavelength of light emitted by said light emitting portion is from 300 nanometers to 550 nanometers.

* * * * *